(12) United States Patent
Stutzman et al.

(10) Patent No.: US 7,692,437 B2
(45) Date of Patent: Apr. 6, 2010

(54) SYSTEMS AND METHODS FOR TESTING PACKAGED MICROELECTRONIC DEVICES

(75) Inventors: A. Jay Stutzman, Boise, ID (US); Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/208,183

(22) Filed: Sep. 10, 2008

(65) Prior Publication Data

US 2009/0009199 A1 Jan. 8, 2009

Related U.S. Application Data

(62) Division of application No. 11/509,907, filed on Aug. 25, 2006, now Pat. No. 7,425,839.

(51) Int. Cl.
*G01R 31/02* (2006.01)

(52) U.S. Cl. .................. 324/758; 324/755
(58) Field of Classification Search .............. 324/158.1, 324/754–765
See application file for complete search history.

(56) References Cited

U.S. PATENT DOCUMENTS

| | | | |
|---|---|---|---|
| 4,744,462 A | 5/1988 | Houseknecht | |
| 4,799,007 A | 1/1989 | Cook et al. | |
| 4,897,598 A | 1/1990 | Doemens et al. | |
| 4,935,696 A * | 6/1990 | DiPerna | 324/761 |
| 6,005,405 A * | 12/1999 | Slutz | 324/761 |
| 6,373,273 B2 | 4/2002 | Akram et al. | |
| 6,525,551 B1 | 2/2003 | Beaman et al. | |
| 6,559,664 B2 * | 5/2003 | DeSimone | 324/754 |
| 6,707,309 B2 | 3/2004 | Sato et al. | |
| 7,043,388 B2 | 5/2006 | Cram | |
| 7,425,839 B2 | 9/2008 | Stutzman et al. | |
| 2006/0250150 A1 | 11/2006 | Tunaboylu et al. | |
| 2007/0257688 A1 | 11/2007 | Cram et al. | |

* cited by examiner

*Primary Examiner*—Ha Tran T Nguyen
*Assistant Examiner*—Joshua Benitez
(74) *Attorney, Agent, or Firm*—Perkins Coie LLP

(57) ABSTRACT

Systems and methods for testing packaged microelectronic devices are disclosed herein. One such system for testing a packaged microelectronic device includes a test socket configured to receive the device for testing and a tester interface including a plurality of test contacts aligned with external contacts of the device when the device is received within the test socket. The system further includes a mask proximate to the test socket and the test contacts. The mask includes a plurality of apertures arranged in a pattern corresponding to the plurality of test contacts and corresponding at least in part to the array of external contacts when the device is received within the test socket. The apertures include (a) first apertures sized to allow the corresponding test contacts to extend completely through the mask, and (b) one or more second apertures sized to allow the corresponding test contacts to extend only partially through the mask.

16 Claims, 8 Drawing Sheets

SYSTEMS AND METHODS FOR TESTING PACKAGED MICROELECTRONIC DEVICES

CROSS-REFERENCE TO RELATED APPLICATION

This application is a divisional of U.S. patent application Ser. No. 11/509,907, filed Aug. 25, 2006, which is incorporated herein by reference in its entirety.

TECHNICAL FIELD

The present disclosure is directed generally toward systems and methods for testing packaged microelectronic devices.

BACKGROUND

Conventional packaged microelectronic devices are manufactured for specific performance characteristics required for use in a wide range of electronic equipment. Packaged microelectronic devices typically include a die with integrated circuitry, a casing encapsulating the die, and an array of external contacts or terminals. Packaged microelectronic devices have an outer shape that defines a package profile. The external contacts can include (a) contacts that protrude from the device (e.g., pin-like leads, ball-pads, solder balls, or bumps of a ball-grid array (BGA), etc.) or (b) non-protruding, generally planar contacts or pads (e.g., land grid arrays (LGA), leadless chip carriers, quad flat-pack no-lead packages, etc.) The external contacts are arranged in a selected pattern and configured to be electrically and physically coupled to other external devices. Different types of packaged devices with different circuitry can have the same outer profile but a different arrangement of external contacts.

After the dies are packaged, the devices are generally tested and marked in several post-production batch processes. Burn-in testing is one such post-production process for detecting whether any of the devices are likely to fail. Burn-in testing is performed before shipping packaged devices to customers or installing packaged devices in electronic equipment. Burn-in testing of packaged devices typically involves applying specified electrical biases and/or signals to the external contacts of the devices in a controlled temperature environment. The packaged devices are generally tested under more severe conditions and/or under more rigorous performance parameters than they are likely to experience during normal operation.

FIG. 1, for example, is a schematic side cross-sectional view of a portion of a conventional testing system 10 including a test bed 20 carrying a packaged microelectronic device 12. The test bed 20 includes a test socket 22 having lead-in surfaces 24 and side surfaces 26 that define a recess 28 for receiving the device 12. A shelf 30 in the recess 28 supports an outer perimeter region of the device 12, and external contacts 14 on the device 12 are positioned within an opening 32 defined by the shelf 30. A tester interface 40 that includes a plurality of test contacts 42 is positioned below the test bed 20 with the test contacts 42 positioned to contact corresponding external contacts 14.

The test contacts 42 can be selected based on the particular configuration of the external contacts 14. For example, if the external contacts 14 include protruding elements such as solder balls, the test contacts 42 can include clamps or pincers configured to pinch or hold the protruding contacts 14. On the other hand, if the external contacts 14 include generally planar elements, such as an LGA, the test contacts 42 can include vertically biased contacts configured to engage the corresponding non-protruding contacts 14. The test socket 22 is movable relative to the tester interface 40 so that the test contacts 42 can engage and apply electrical signals to corresponding external contacts 14 for testing the device 12. Although only a single test socket 22 and device 12 are shown in FIG. 1, it will be appreciated that the system 10 can include a number of test sockets 22 for testing a number of devices 12 either individually or in a batch process.

One problem with conventional testing systems is that it is difficult to perform burn-in tests for runs of devices having different configurations. For example, the arrangement of external contacts on one batch of devices to be tested may be different than the arrangement of external contacts on another batch of devices and, accordingly, the external contacts of the individual devices may not be aligned with corresponding test contacts. In the testing system 10 of FIG. 1, for example, the arrangement of test contacts 42 may not be the same as the arrangement of external contacts 14 on the device 12. As such, the external contacts 14 may not be properly aligned with the test contacts 42 and the device 12 may fail the test even though the device 12 otherwise functions properly. Furthermore, if one or more portions of the device 12 are not populated with external contacts 14, the test contact(s) 42 aligned with that portion of the device 12 can scratch, impinge, pierce, and/or otherwise damage the device 12. In some cases, for example, the unmatched test contacts 42 can puncture the soft, protective coating on an external surface of the device 12 and damage or short out the device's internal circuitry.

One approach to addressing this drawback is to reconfigure the testing system to accommodate the different arrangements of external contacts on each device to be tested. In the testing system 10 of FIG. 1, for example, the system can be reconfigured by replacing the test sockets 22 with different test sockets configured for use with a particular batch of devices. Further, in some cases the tester interface 40 can be reconfigured by adding or eliminating test contacts 42 such that the number and arrangement of test contacts 42 is precisely coordinated with the arrangement of external contacts 14 on the device 12. In a typical large scale manufacturing process for microelectronic devices, however, replacing each of the test sockets 22 and/or reconfiguring the test contacts 42 to test devices having different arrangements of external contacts typically involves reconfiguring a large number of system components. This process is accordingly extremely labor-intensive, time-consuming, and expensive because it not only requires many hours of skilled labor, but it also results in costly downtime for the testing systems. Accordingly, there is a need for improved systems and methods for testing microelectronic devices.

DETAILED DESCRIPTION

The following disclosure describes several embodiments of systems and methods for testing packaged microelectronic devices. The term "microelectronic device" is used throughout to include semiconductor devices, microfeature devices, micromechanical devices, optics, data storage elements, read/write components, and other articles of manufacture. For example, microelectronic devices can include imagers, SRAM, DRAM (e.g., DDR-SDRAM), flash memory (e.g., NAND flash memory), ASICS, processors, flip chips, LGA chips, ball-grid array chips, and other types of microelectronic devices or components. Several specific details of the invention are set forth in the following description and in FIGS. 2-6 to provide a thorough understanding of certain embodiments of the invention. A person skilled in the relevant art will understand, however, that the invention has additional embodiments, and that the invention may be practiced without several of the specific features described below.

Figure 2:
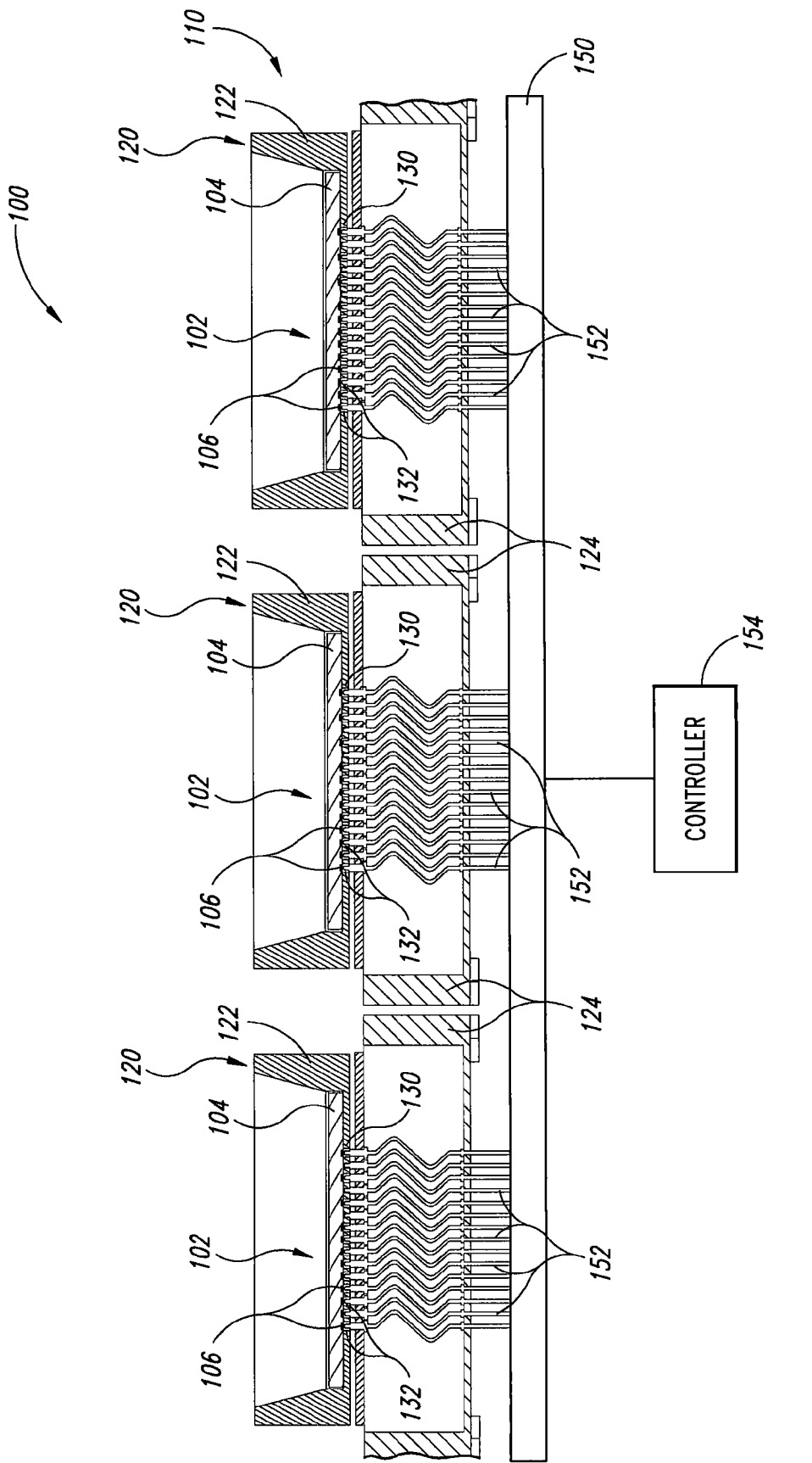
FIG. 2 is a schematic side cross-sectional view of a system for testing a plurality of microelectronic devices in accordance with one embodiment of the invention.

FIG. 2 is a schematic side cross-sectional view of a system 100 for testing a plurality of packaged microelectronic devices 102 in accordance with one embodiment of the invention. Each device 102 includes a substrate 104, integrated circuitry (not shown), and a plurality of external contacts or pads 106 arranged in a desired array on the substrate 104. In the illustrated embodiment, for example, the contacts 106 are arranged in an LGA. In other embodiments, however, the devices 102 can have other configurations and/or can include other types of semiconductor components. The system 100 can test the devices 102 individually or in a batch process to ensure and verify that the devices 102 function according to specification.

The illustrated system 100 includes a test tray 110 and a plurality of test sockets 120 carried by the test tray 110. The individual test sockets 120 include (a) a nesting portion 122 configured to carry corresponding devices 102, and (b) a base portion 124 configured to support the nesting portion 122. The system 100 also includes a tester interface 150 having a plurality of test contacts or electrical interconnect elements 152 arranged in an array corresponding at least in part to the external contacts 106 on the individual devices 102. The illustrated test contacts 152 include vertically activated spring-type contacts. In other embodiments, however, the test contacts 152 can include other types of contacts or interconnect elements. The test sockets 120 and/or the test contacts 152 are movable relative to each other so that the test contacts 152 can selectively contact and apply electrical signals to external contacts 106 and test the devices 102. The system 100 also includes a controller 154 operatively coupled to the tester interface 150. The controller 154 sends/receives signals from the devices 102 via the tester interface 150.

The system 100 further includes a mask 130 between the individual devices 102 within each test socket 120 and the corresponding test contacts 152. In the illustrated embodiment, the masks 130 are an integral component of the nesting portions 122 of each test socket 120. In other embodiments, however, the masks 130 can be separate components removably installed with each test socket 120. The individual masks 130 each include a plurality of apertures 132 arranged in a pattern corresponding to the particular arrangement of test contacts 152 and also corresponding at least in part to the array of external contacts 106 on the devices 102. More specifically, each mask 130 includes a number of apertures 132 configured to allow corresponding test contacts 152 to extend completely through the mask and contact the external contacts 106, and one or more additional apertures configured to prevent the corresponding test contacts from extending completely through the mask such that the test contacts 152 do not engage the corresponding devices 102. Further details regarding the test sockets 120 and masks 130 are described below with reference to FIGS. 3A-6.

Figure 3A:
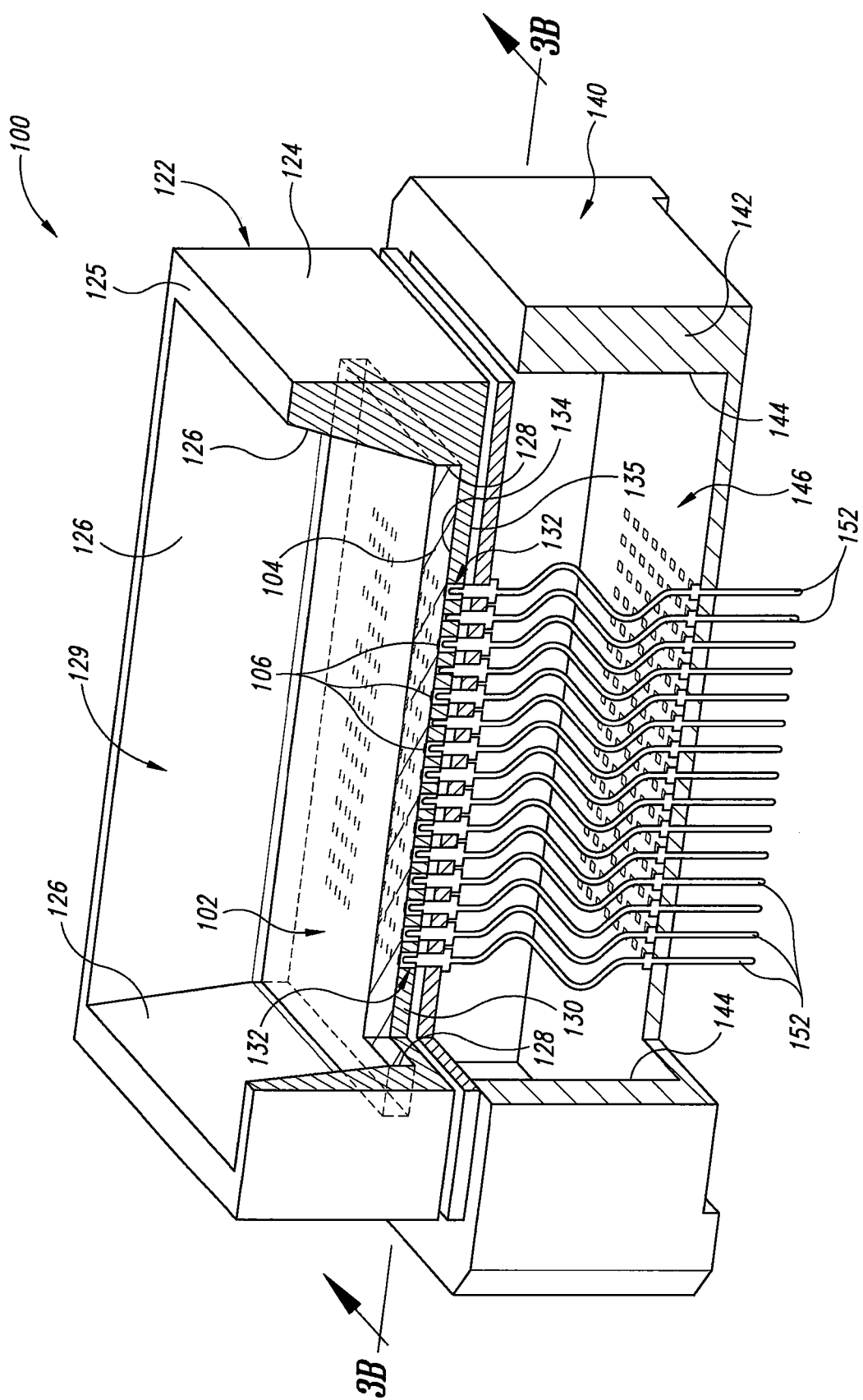
FIG. 3A is an isometric view including a cut-out portion of one of the test sockets of FIG. 2.
Figure 3B:
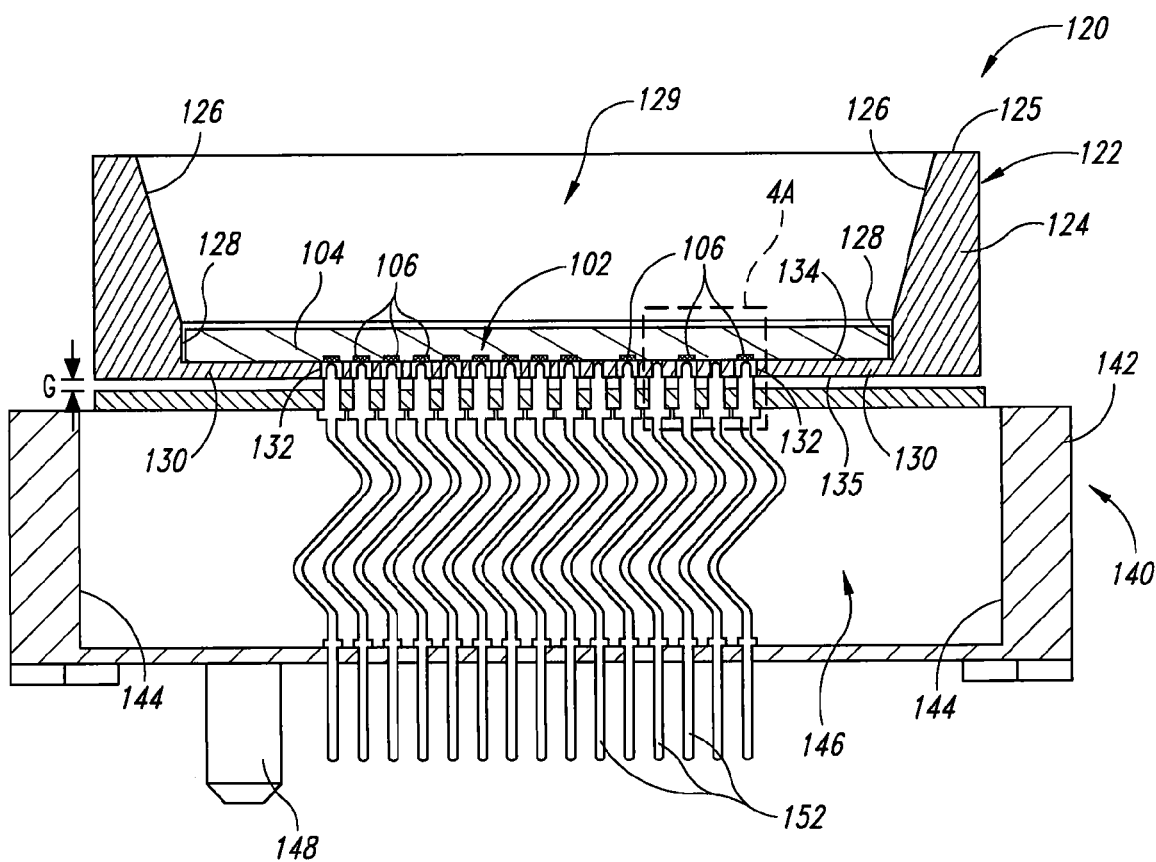
FIG. 3B is a side cross-sectional view of the test socket of FIG. 3A taken substantially along the line 3B-3B.

FIG. 3A, for example, is an isometric view including a cut-out portion of one of the test sockets 120 of FIG. 2. FIG. 3B is a side cross-sectional view of the test socket 120 of FIG. 3A taken substantially along the line 3B-3B. Each of these Figures has been greatly simplified to illustrate only particular aspects of the test socket 120 and, accordingly, a number of components associated with the test socket 120 are not shown. For example, a socket lid and a force distribution member (e.g., a pusher assembly) are not illustrated to avoid obscuring particular aspects of the test socket 120.

Referring to FIGS. 3A and 3B together, the nesting portion 122 of the illustrated test socket 120 includes a body 124 having a plurality of lead-in surfaces 126, a plurality of side surfaces 128 connected to corresponding lead-in surfaces 126, and the mask 130 extending between the side surfaces 128. The lead-in surfaces 126, side surfaces 128, and mask 130 define a recess 129 for receiving one of the devices 102. The recess 129 is shaped to closely correspond to the outer profile or shape of the device 102. For example, the lead-in surfaces 126 taper inwardly from a top surface 125 of the body 124 to the side surfaces 128 to control the position of the device 102 within the test socket 120 in three dimensions (e.g., the x, y, and z axes) such that the device 102 is precisely positioned in the test socket 120. In other embodiments, the body 124 can have other configurations that may not include four lead-in surfaces 126 and/or four side surfaces 128. For example, the body 124 can include one tapered lead-in surface extending from the top surface 125 to the mask 130 and three non-tapered side surfaces extending from the top surface 125 to the mask 130. In other embodiments, the body 124 can have a number of other arrangements and/or configurations.

The base portion 140 of the test socket 120 includes a body 142 and a plurality of side surfaces 144 that define an opening 146 through which the test contacts 152 extend between the tester interface 150 (FIG. 2) and the mask 130. As discussed previously, the base portion 140 is configured to carry or otherwise support the nesting portion 122. In the illustrated embodiment, for example, the nesting portion 122 is spaced apart or otherwise suspended above the base portion 140 by a gap G. During a testing operation, the nesting portion 122 is moved relative to the base portion 140 to bring the two portions into contact and bring the test contacts 152 into contact with corresponding external contacts 106 to test the device 102. The base portion 140 further includes one or more alignment features 148 (FIG. 3B) to properly position the test socket 120 relative to the test bed 110 (FIG. 2). In the illustrated embodiment, for example, the alignment feature 148 is a pin that mates with a corresponding aperture in the test bed 110 (FIG. 2) to precisely align the test socket 120.

The mask 130 includes a first surface or support surface 134 facing the device 102 and a second surface or an exterior surface 135 opposite the support surface 134. The apertures 132 extend through the mask 130 from the support surface 134 to the exterior surface 135. In the illustrated embodiment, the mask 130 is an integral component of the nesting portion 122. In other embodiments, however, such as the embodiment discussed below with reference to FIG. 5, the mask can be a separate component from the nesting portion 122. As discussed previously, the apertures 132 are arranged in an array corresponding at least in part to the array of external contacts 106 on the device 102. More specifically, the apertures 132 are configured to selectively allow certain test contacts 152 to contact corresponding external contacts 106, while blocking or otherwise restricting other test contacts 152 from contacting the device 102. Further details regarding the apertures 132 and the test elements 152 are discussed below with reference to FIGS. 4A and 4B.

Figure 4A:
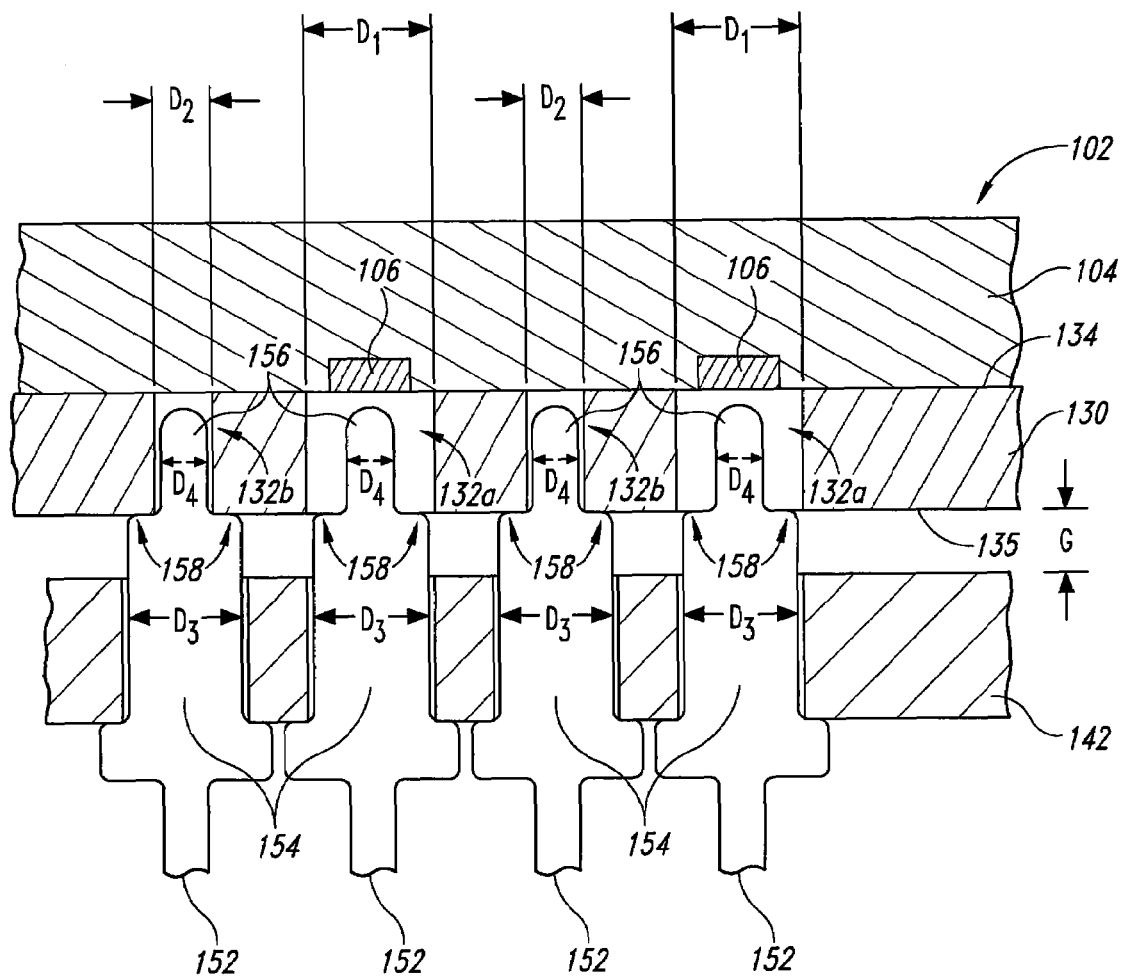
FIGS. 4A and 4B are enlarged views of a portion of the test socket shown in FIG. 3B.
Figure 4B:
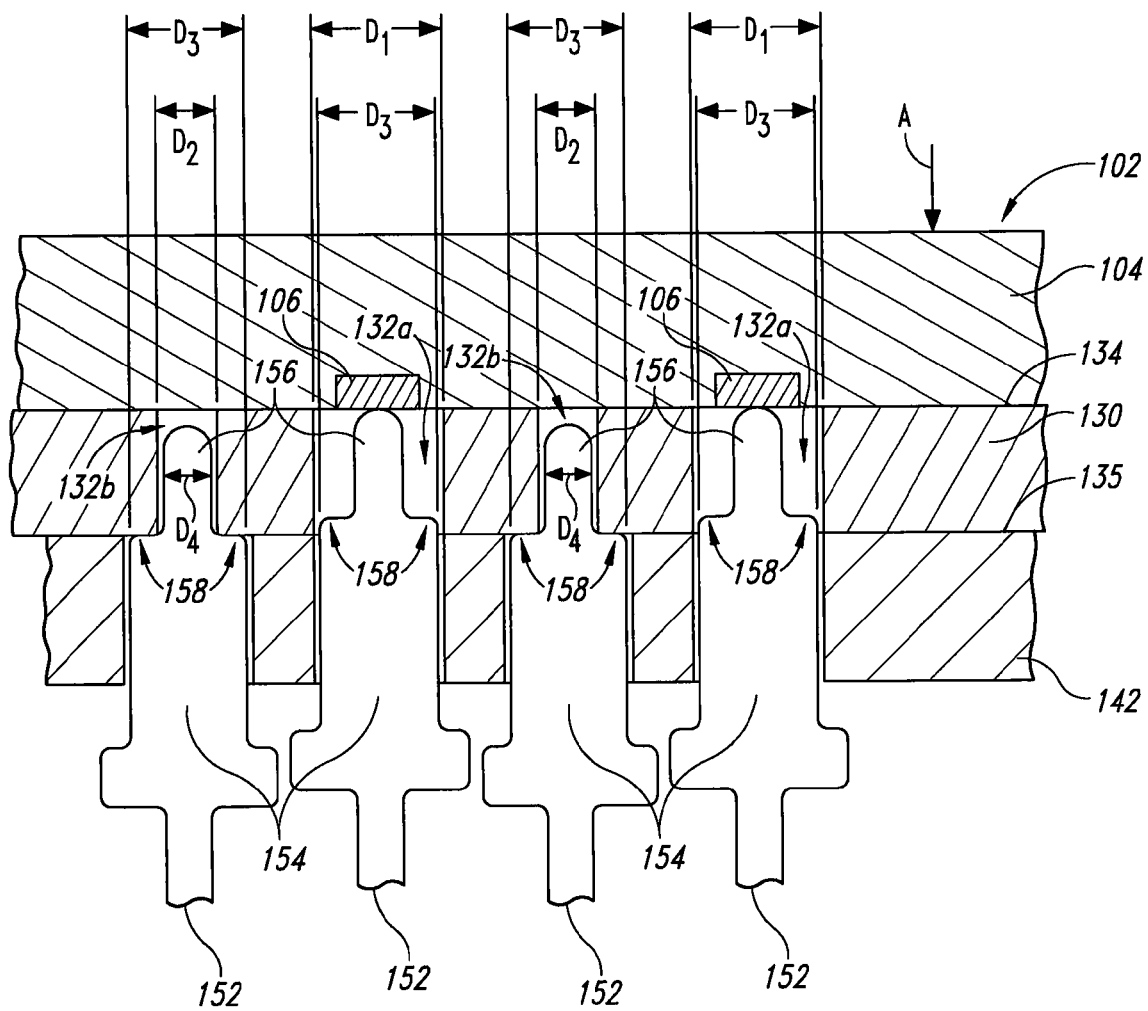

FIGS. 4A and 4B are enlarged views of an area 4A shown in FIG. 3B. Referring first to FIG. 4A, the size, position, and configuration of the apertures 132 through the mask 130 correspond with the arrangement of external contacts 106 on the device 102. In the illustrated embodiment, for example, the mask 130 includes first apertures 132a aligned with at least some of the external contacts 106, and second apertures 132b aligned with unpopulated portions of the device 102 (e.g., apertures that are not aligned with any of the external contacts 106). The first apertures 132a have a first diameter or cross-sectional dimension $D_1$ and the second apertures 132b have a second diameter or cross-sectional dimension $D_2$ less than the first diameter $D_1$.

Individual test contacts 152 are aligned with each of the first and second apertures 132a and 132b, and at least a portion of each test contact 152 extends into the corresponding aperture. More specifically, the test contacts 152 each include a body portion 154, an engagement or tip portion 156 extending from the body portion 154 into at least a portion of the individual apertures 132, and a shoulder 158 between the body portion 154 and the engagement portion 156. The shoulder 158 can be a rim or other lateral element extending transversely with respect to the body portion 154 and the engagement portion 156. Each body portion 154 has a third diameter or cross-sectional dimension $D_3$ greater than the second diameter $D_2$, but less than the first diameter $D_1$. Each engagement portion 156 has a fourth diameter or cross-sectional dimension $D_4$ less than the first, second, and third diameters $D_1$, $D_2$, and $D_3$, respectively.

Referring next to FIG. 4B, a force (as shown by the arrow A) is applied to the device 102 and/or the nesting portion 122 (FIG. 3B) to move the device 102 relative to the test contacts 152. As the force F moves the device 102 downward, selected test contacts 152 contact the external contacts 106 for testing, while other test contacts 152 are blocked or otherwise restricted from contacting the device 102. More specifically, the device 102 and the mask 130 move relative to the test contacts 152 until the exterior surface 135 of the mask 130 contacts the body 142 of the base portion 140 (FIG. 3B). This downward movement of the mask 130 accordingly urges the device 102 and mask 130 toward the test contacts 152. Because the first diameter $D_1$ of the first apertures 132a is greater than the third diameter $D_3$ of the body portion 154 of the test contacts 152, the test contacts 152 can move through at least a portion of each first aperture 132a until the engagement portions 156 contact corresponding external contacts 106.

On the other hand, the second diameter $D_2$ of the second apertures 132b is less than the third diameter $D_3$. Accordingly, the shoulders 158 of the test contacts 152 aligned with the second apertures 132b engage the exterior surface 135 of the mask 130 proximate to the corresponding second apertures 132b and prevent the engagement portions 156 from moving completely through the second apertures 132b into contact with the device 102. Because the second diameter $D_2$ of the second apertures 132b is greater than the fourth diameter $D_4$ of the engagement portions 156, however, the engagement portions 156 of the test contacts 152 aligned with the second apertures 132b do not make physical contact with the mask 130. The second apertures 132b accordingly prevent the corresponding engagement portions 156 from physically engaging the mask 130 and potentially being damaged or broken as a result of such contact. In other embodiments, the mask 130 can have a number of other arrangements and/or configurations. Additional embodiments of masks for test sockets are described below with reference to FIGS. 5 and 6. In any of these embodiments, the mask can be configured to selectively allow certain test contacts 152 to engage the device 102, while restricting other test contacts 152 from engagement in a way that protects the delicate and sensitive test contacts 152 from damage.

The array of apertures 132 in the mask 130 described above with reference to FIGS. 2-4B can be used to selectively control which test contacts 152 engage the external contacts 106 on the device 102, and which do not. For example, the mask 130 can prevent the test contacts 152 aligned with unpopulated portions of the device 102 (e.g., portions that do not include an external contact 106) from contacting the device 102. As a result, the device substrate 104 is significantly less likely to be contaminated and/or damaged by the test contacts 152. In some embodiments, for example, the device 102 may only have a thin, soft protective coating over its internal components. In many conventional sockets, such as those described previously, the test contacts can engage unpopulated portions of the device and pierce or otherwise break through the protective coating to damage or short out the internal circuitry. The illustrated test socket 120 can accordingly reduce the likelihood that the devices 102 will be damaged and/or contaminated during testing. Moreover, residue and/or debris from the substrate 104 will not accumulate on the test contacts 152. Such residue can negatively impact the performance of the affected test contacts 152 and potentially cause the test contacts 152 to malfunction and/or become inoperable.

Embodiments of the test sockets 120 described above with reference to FIGS. 2-4B include the nesting portion 122 and integral mask 130 as a modular component that can be removed from the test socket 120 and replaced with another nesting portion having a customized mask based on the particular configuration of each batch of devices to be tested. As a result, replacing the nesting portion 122 with the integral mask 130 is a relatively quick and easy process compared to the conventional systems described above in which the entire test socket 120 and/or the tester interface 150 must be replaced or reconfigured before testing a batch of devices having a different configuration. Furthermore, the cost of keeping an inventory of nesting portions 122 with masks 130 having different configurations is less than the cost of keeping an inventory of entire test sockets and associated hardware. The testing system 100 including the test sockets 120, for example, provides a significant reduction in tooling cost as compared with testing systems using conventional test sockets where a large number of different test sockets must be kept on hand for testing devices having different configurations.

In at least some of the embodiments of the test sockets 120 described above, it may be desirable to isolate one or more populated portions of a particular device 102 during testing. Isolating selected external contacts 106, for example, can be used to change the particular device's functionality. The mask 130 can accordingly include second apertures 132b aligned with one or more external contacts 106 to prevent the corresponding test contacts 152 from contacting the respective external contacts 106 during testing. Nesting portions 120 including the integral mask 130 can make this process relatively quick and easy to accomplish and, accordingly, can facilitate a number of different testing approaches that were too time-consuming and/or expensive with conventional testing systems.

Figure 5:
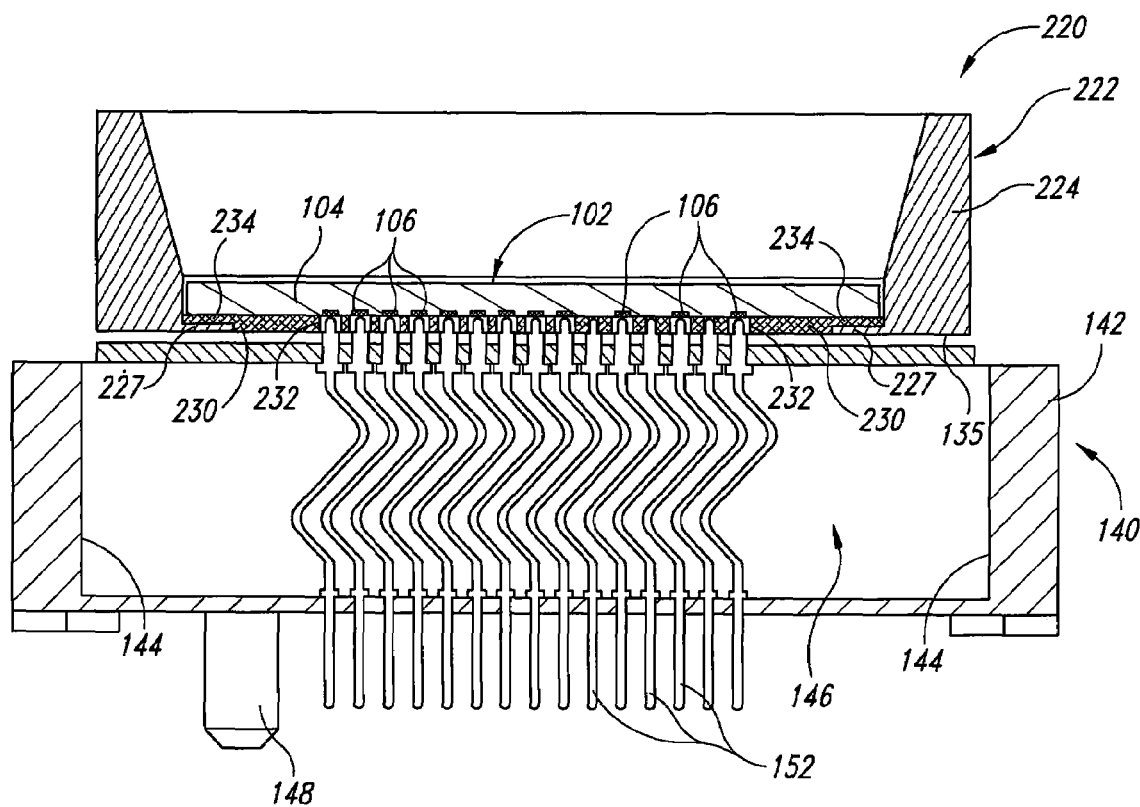
FIG. 5 is a side cross-sectional view of a test socket configured in accordance with another embodiment of the invention.

FIG. 5 is a side cross-sectional view of a test socket 220 configured in accordance with another embodiment of the invention. The test socket 220 includes a number of features generally similar to the test socket 120 described above and, accordingly, like reference numbers refer to like components in FIGS. 2-3B and FIG. 5. The test socket 220 differs from the test socket 120 described previously in that the test socket 220 has a nesting portion 222 with a different configuration than the nesting portion 122.

More specifically, the nesting portion 222 does not include an integral masking portion. Rather, a mask 230 can be installed in and uninstalled from a body 224 of the nesting portion 222. In the illustrated embodiment, for example, the body 224 includes a shelf 227 proximate to the base of the body 224. The mask 230 includes a referencing element 234 for contacting the shelf 227 and precisely positioning the mask 230 relative to the body 224. In other embodiments, however, the mask 230 can be positioned within the nesting portion 222 using another arrangement.

The mask 230 can be generally similar to the mask 130 described above. For example, the mask 230 includes a plurality of apertures 232 arranged in an array corresponding at least in part to the array of external contacts 106 on the device 102. The mask 230 can accordingly perform many of the same functions as the mask 130 described above with reference to FIGS. 2-4B. In addition, reconfiguring the test socket 220 to test a batch of devices having a different configuration includes only replacing the mask 230 with another mask having a desired arrangement. Thus, the cost of testing multiple device types can be reduced because keeping an inventory of masks 230 having different configurations is expected to be significantly less costly than keeping an inventory of larger and more complex test sockets 220.

Figure 1:
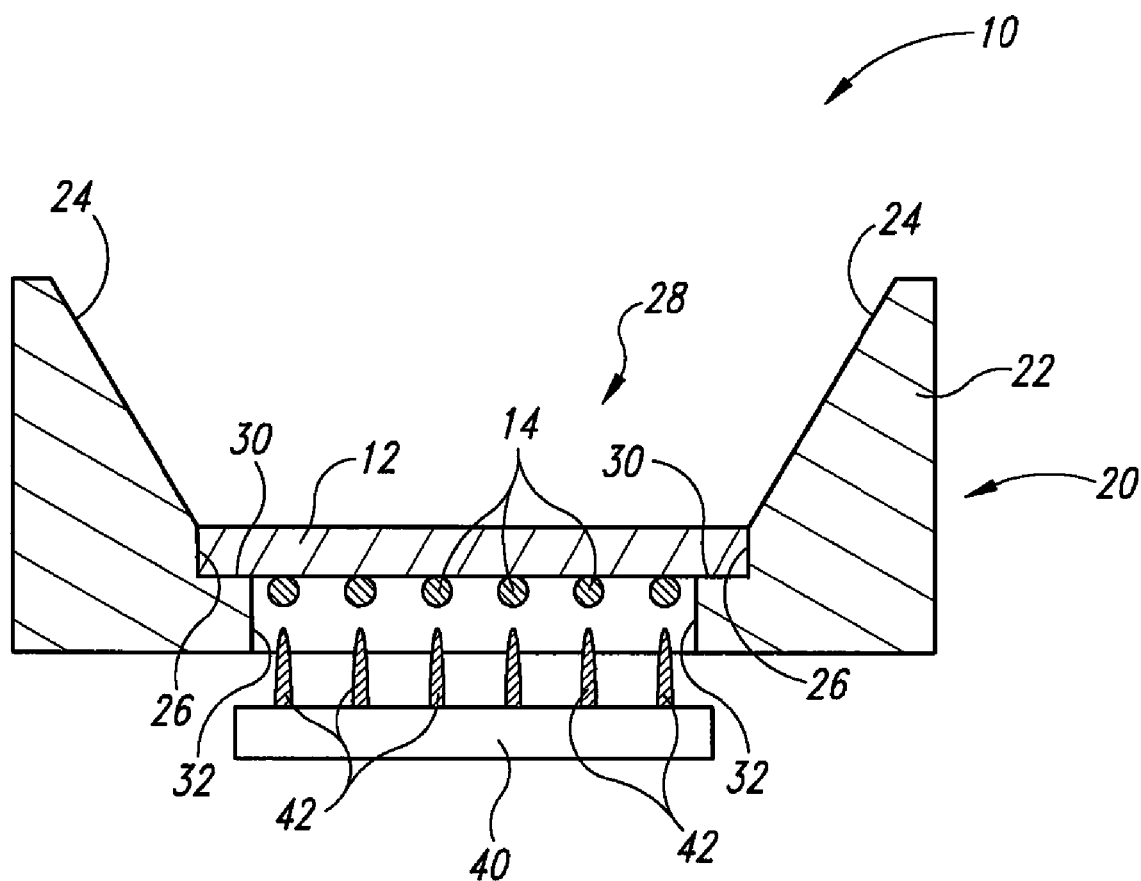
FIG. 1 is a schematic side cross-sectional view of a portion of a system for testing microelectronic devices in accordance with the prior art.

In at least some embodiments, the mask 230 can be retrofit onto existing test sockets, such as the socket 20 illustrated in FIG. 1, so that the test contacts can contact and apply electrical signals to only selected external contacts on the device. Accordingly, several of the drawbacks associated with conventional test sockets described above with reference to FIG. 1 can be overcome by using the mask 230 in conjunction with conventional test sockets.

Figure 6:
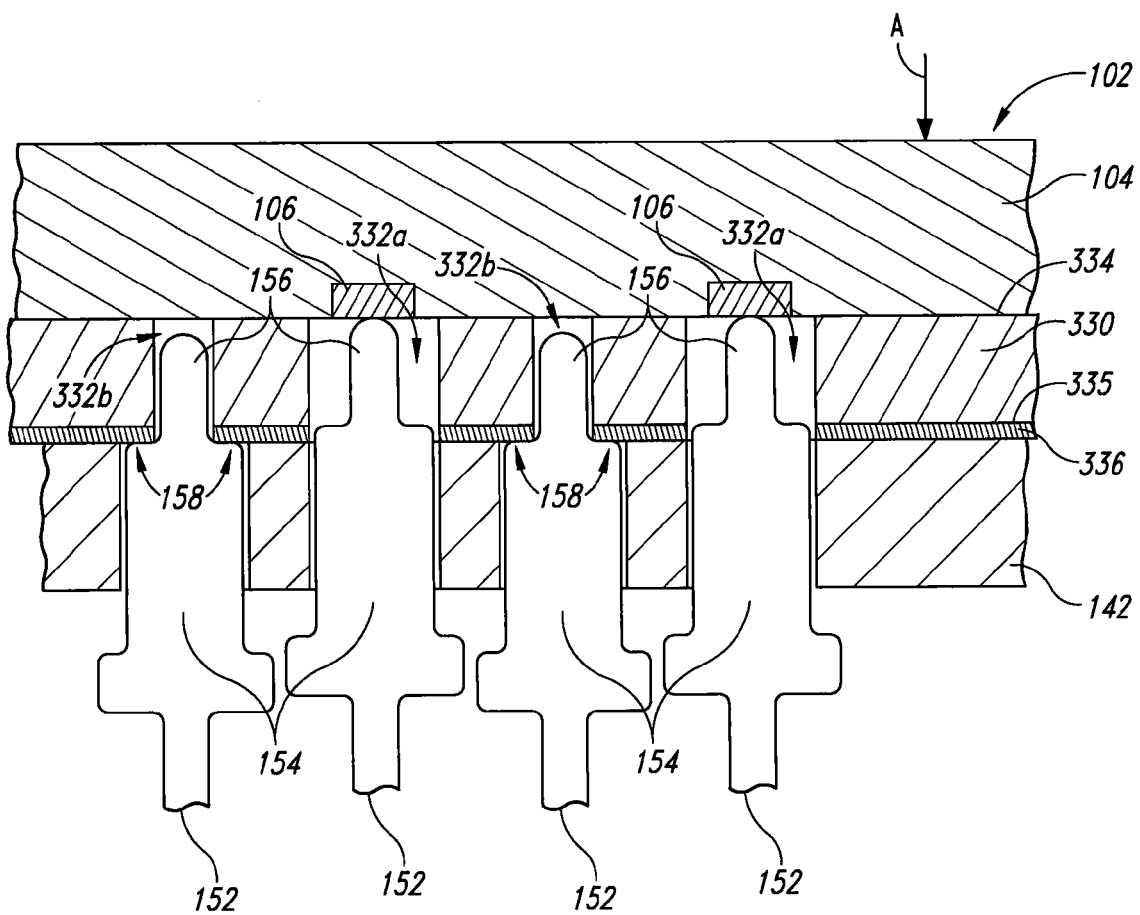
FIG. 6 is a side cross-sectional view of a portion of a test socket configured in accordance with still another embodiment of the invention.

FIG. 6 is a side cross-sectional view of a portion of a test socket 320 configured in accordance with still another embodiment of the invention. More specifically, FIG. 6 illustrates a portion of the test socket 320 after the force A is applied to the device 102 and/or the nesting portion (not shown) to move the device 102 relative to the test contacts 152. This view of the test socket 320 and device 102 in FIG. 6 is generally similar to the view described above with reference to FIG. 4B. The illustrated test socket 320, however, differs from the test sockets 120 and 220 described previously in that the test socket 320 has a mask 330 with a different configuration than the previously-described masks 130 and 230.

The mask 330, for example, includes a conductive layer 336 at an exterior surface 335 of the mask 330. The conductive layer 336 can be on and/or in the mask 330. The conductive layer 336 can include, for example, electrically conductive plating, electrically conductive paint, one or more conductive vias extending through at least a portion of the mask 330, and/or other types of suitable electrical contacts or pads. The conductive layer 336 may cover all or just a portion of the exterior surface 335 of the mask 330. The mask 330 also includes a support surface 334 opposite the exterior surface 335 and a plurality of first apertures 332a and second apertures 332b extending through the mask 330 from the support surface 334 to the exterior surface 335. The first and second apertures 332a and 332b are generally similar to the first and second apertures 132a and 132b described above. For example, the first apertures 332a are arranged in an array corresponding at least in part to the array of external contacts 106 on the device 102, while the second apertures 332b are generally aligned with unpopulated portions of the device 102. In operation, one or more of the shoulders 158 of each test contact 152 aligned with the second apertures 332b can engage the conductive layer 336 and electrically couple the respective contact to the conductive layer 336 for shorting, grounding, bridging, or otherwise electrically coupling the tester interface (not shown) to one or more portions of the conductive layer 336. This allows the user to selectively isolate particular contacts for further diagnosis.

From the foregoing, it will be appreciated that specific embodiments of the invention have been described herein for purposes of illustration, but that various modifications may be made without deviating from the spirit and scope of the invention. For example, the test contacts can include a number of other types of vertically-activated electrical interconnect elements including, but not limited to, flat spring elements (e.g., stamped or chemically etched), formed spring elements, and/or other suitable types of spring probe assemblies. Further, many of the elements of one embodiment can be combined with other embodiments in addition to, or in lieu of, the elements of the other embodiments. Accordingly, the invention is not limited except as by the appended claims.

We claim:

1. A method of testing a packaged microelectronic device including an array of external contacts, the method comprising:
    placing the device in a test socket with the external contacts facing a mask positioned proximate to the test socket, the mask including a plurality of apertures aligned with at least some of the external contacts; and
    inserting test contacts into corresponding apertures and selectively allowing some of the test contacts to engage corresponding external contacts while preventing other test contacts from touching the device, wherein inserting test contacts into corresponding apertures includes inserting the test contacts into (a) first apertures sized to allow the corresponding test contacts to extend completely through the mask to the external contacts, and (b) one or more second apertures sized to allow the corresponding test contacts to extend only partially through the mask.

2. The method of claim 1 wherein inserting test contacts into corresponding apertures includes inserting the test contacts into (a) the first apertures having a first cross-sectional dimension sized to allow the corresponding test contacts to extend completely through the mask to engage the corresponding external contacts, and (b) the one or more second apertures having a second cross-sectional dimension less than the first cross-sectional dimension, the second cross-sectional dimension being sized to allow the corresponding test contacts to extend only partially through the mask.

3. The method of claim 1 wherein the individual test contacts include vertically arranged electrical interconnect elements having a body portion, a tip portion projecting from the body portion, and a shoulder portion between the body portion and the tip portion, and wherein:

inserting test contacts into corresponding apertures and selectively allowing some of the test contacts to engage corresponding external contacts while preventing other test contacts from touching the device includes (a) inserting the test contacts aligned with the first apertures completely through the mask until the tip portion of each test contact engages the corresponding external contact, and (b) inserting the test contacts aligned with the second apertures partially through the mask until the shoulder portions of the test contacts engage the mask and prevent the corresponding test contacts from touching the device.

4. The method of claim 1 wherein placing the device in a test socket with the external contacts facing a mask positioned proximate to the test socket includes placing the device in a test socket having an integral mask.

5. The method of claim 1, further comprising electrically coupling one or more of the test contacts prevented from touching the device to a conductive layer carried by the mask and electrically isolated from the device.

6. The method of claim 1 wherein inserting test contacts into corresponding apertures and selectively allowing some of the test contacts to engage corresponding external contacts includes inserting spring-type electrical interconnect elements into corresponding apertures to selectively contact generally planar, non-protruding external contacts on the device.

7. The method of claim 1 wherein the mask is a separate component removably installed with the test socket, and wherein the method further comprises removing the mask from the test socket after testing the device.

8. The method of claim 1 wherein the packaged microelectronic device is a first device having a first array of external contacts and the mask is a first mask having a plurality of apertures arranged in a first pattern, and wherein the method further comprises:
removing the first mask;
installing a second mask with the test socket after removing the first mask, the second mask having a plurality of apertures arranged in a second pattern different than the first pattern;
placing a second packaged microelectronic device in the test socket with the external contacts of the second packaged device facing the second mask and the plurality of apertures in the second pattern aligned with at least some of the external contacts; and
inserting test contacts into the corresponding apertures in the second mask and selectively allowing some of the test contacts to engage corresponding external contacts of the second packaged device while preventing other test contacts from touching the second device.

9. The method of claim 8 wherein installing a second mask with the test socket, placing a second packaged device in the test socket, and inserting the test contacts into the corresponding apertures in the second mask occurs without reconfiguring the arrangement of the test contacts.

10. The method of claim 1 wherein inserting test contacts into corresponding apertures and selectively allowing some of the test contacts to engage corresponding external contacts while preventing other test contacts from touching the device includes preventing a particular test contact aligned with a particular external contact from touching the particular external contact.

11. The method of claim 1 wherein inserting test contacts into corresponding apertures and selectively allowing some of the test contacts to engage corresponding external contacts while preventing other test contacts from touching the device includes preventing a particular test contact that is not aligned with the external contacts from touching a region on the device between the external contacts.

12. A method of testing a packaged microelectronic device having an array of external contacts, the method comprising:
installing the packaged device in a test socket with the external contacts of the packaged device facing a mask positioned between the packaged device and a tester interface; and
selectively allowing a tip portion of certain test contacts to extend completely through the mask and touch the packaged device while restricting a tip portion of other test contacts from touching the packaged device without making physical contact with the tip portions of the test contacts.

13. The method of claim 12 wherein installing the packaged device in a test socket with the external contacts of the packaged device facing a mask includes installing the packaged device with the external contacts facing a mask having a plurality of apertures arranged in a pattern corresponding to the plurality of test contacts and corresponding at least in part to the array of external contacts when the packaged device is installed with the test socket.

14. The method of claim 12 wherein selectively allowing a tip portion of certain test contacts to extend completely through the mask and touch the packaged device while restricting other test contacts from touching the packaged device includes inserting the test contacts into (a) a plurality of first apertures in the mask and sized to allow the corresponding tip portions to extend completely through the mask and touch the external contacts on the packaged device, and (b) a plurality of second apertures in the mask and sized to prevent the tip portions from extending completely through the mask with physically contacting the tip portions of the associated test contacts.

15. The method of claim 12 installing the packaged device in a test socket with the external contacts of the packaged device facing a mask includes removably installing the mask with the test socket before installing the packaged device.

16. A method of testing packaged microelectronic devices, the method comprising:
placing a first microelectronic device having a first array of external contacts in a test socket with the external contacts facing a first mask positioned proximate to the test socket, the first mask including a plurality of first apertures arranged in a first pattern and aligned with at least some of the external contacts of the first device; and
inserting test contacts into corresponding first apertures and selectively allowing some of the test contacts to engage corresponding external contacts of the first device while preventing other test contacts from touching the first device;
removing the first mask;
installing a second mask with the test socket after removing the first mask, the second mask having a plurality of apertures arranged in a second pattern different than the first pattern;
placing a second packaged microelectronic device in the test socket with the external contacts of the second packaged device facing the second mask and the plurality of apertures in the second pattern aligned with at least some of the external contacts of the second device; and
inserting test contacts into the corresponding apertures in the second mask and selectively allowing some of the test contacts to engage corresponding external contacts of the second device while preventing other test contacts from touching the second device.

* * * * *